United States Patent
Coteus et al.

(10) Patent No.: US 8,174,106 B2
(45) Date of Patent: May 8, 2012

(54) THROUGH BOARD STACKING OF MULTIPLE LGA-CONNECTED COMPONENTS

(75) Inventors: Paul W. Coteus, Yorktown, NY (US); Shawn A. Hall, Pleasantville, NY (US); Gareth G. Hougham, Ossining, NY (US); Alphonso P. Lanzetta, Marlboro, NY (US); Rick A. Rand, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 1082 days.

(21) Appl. No.: 11/511,815

(22) Filed: Aug. 29, 2006

(65) Prior Publication Data

US 2008/0054430 A1  Mar. 6, 2008

(51) Int. Cl.
  *H01L 23/02* (2006.01)

(52) U.S. Cl. ........ 257/686; 257/685; 257/701; 257/723; 257/690; 257/E21.449

(58) Field of Classification Search ............... 257/686, 257/685, 701, 723, 690, E21.723
See application file for complete search history.

(56) References Cited

U.S. PATENT DOCUMENTS

| | | | |
|---|---|---|---|
| 5,982,635 A * | 11/1999 | Menzies et al. | 361/790 |
| 6,386,890 B1 * | 5/2002 | Bhatt et al. | 439/67 |
| 6,477,058 B1 * | 11/2002 | Luebs et al. | 361/784 |
| 6,903,941 B2 * | 6/2005 | Paola | 361/803 |
| 7,254,027 B2 * | 8/2007 | Belady et al. | 361/704 |
| 2006/0109629 A1 * | 5/2006 | Harris et al. | 361/704 |

OTHER PUBLICATIONS

United States Office Action dated Sep. 19, 2011 received in related U.S. Appl. No. 12/543,104.

* cited by examiner

*Primary Examiner* — Junghwa M Im
(74) *Attorney, Agent, or Firm* — Scully, Scott, Murphy & Presser, P.C.; Daniel P. Morris, Esq.

(57) ABSTRACT

A package design is provided where a chip module is connected to a printed circuit board (PCB) via a land grid array (LGA) on the top surface of the PCB, and where a power supply is connected to the PCB via a second LGA on the bottom surface of the PCB. The stack of the chip module, power supply, and LGA is held in place and compressed with actuation hardware forming an adjustable frame. The package allows field replaceability of either the module, or the PS, and provides the shortest possible wiring distance from the PS to the module leading to higher performance.

20 Claims, 4 Drawing Sheets

THROUGH BOARD STACKING OF MULTIPLE LGA-CONNECTED COMPONENTS

This invention was made with Government support under Contract No.: NBCH3039004 (DARPA) awarded by Defense, Advanced Research Projects Agency. The Government has certain rights in this invention.

FIELD OF THE INVENTION

This invention relates to a package where a chip module is connected to a printed circuit board (PCB) via a land grid array (LGA), and more particularly, the package includes the LGA on a top surface of the PCB and a power supply connected to the PCB via a second LGA on the bottom surface of the PCB.

BACKGROUND OF THE INVENTION

One type of surface-mount packaging used for integrated circuits (IC) is pin grid array (PGA). In PGA pins are used to conduct electrical signals from the integrated circuit to a printed circuit board (PCB) the IC is placed on. Another type of surface-mount packaging used for integrated circuits is ball grid array (BGA). Using BGA, connector pins are replaced by balls of solder joined to the bottom of the package. A device is placed on a PCB that carries copper pads in a pattern that matches the solder balls. Repair to the components of the chip module is completed by shipping the PCB and soldered module to a repair facility which is expensive and time consuming.

A land grid array (LGA) is a physical interface for some microprocessors package families. Unlike the pin grid array (PGA) interface found on most available processors, there are no pins on the chip module for LGA. Instead, on the LGA, is a separate, interposed structure consisting of an array of conducting compliant contacts which touch the conductive pads on the bottom of the chip module and also touch the pads on the motherboard.

Land Grid Array (LGA) interposers are typically used to reversibly connect a chip module to a printed circuit board (PCB). This brings both signal and power from the PCB to and from the module. Power supplies serving the module are usually located on the PCB as close to the module as possible to minimize the wiring distance and the associated resistive losses and time delays. However, the minimal distance possible where a power supply is immediately adjacent to the module still limits the closeness to an extent equal to or greater than the width of the power supply for at least some fraction of wiring paths.

Chip packages experience time delays and higher power usage resulting from the distance between the power supply and the module. Current packages attempt to mitigate the delay time resulting from the distance between the power supply and the module by having small decoupling capacitors (decaps) soldered on the printed wiring board, and as close to the module as possible to store as much energy from the power supply. Thus, when the chip calls for power, the power comes from the capacitor first rather than having to go all the way out to a power supply.

Moreover, in conventional electronic packaging designs utilizing BGA connections, repair to chip modules is conducted off-line, e.g. at a repair facility which requires extra cost in terms of shipping, time delays, etc.

It would therefore be desirable for a chip module to be capable of being repaired in the field. It would also be desirable for components of a chip module to be individually removable for repair. It would further be desirable to minimize wiring distances between components and a power supply in a module package.

SUMMARY OF THE INVENTION

In an aspect of the present invention a chip module package or system for use with an electronic device comprises a first land grid array (LGA) positioned between and coupled to a chip module and a first side of a first printed circuit board (PCB). A second LGA is positioned between and coupled to a power supply and a second side of the first PCB. The second LGA has connections for electrically coupling the power supply to the PCB. An adjustable support frame is adapted to compressively support the first LGA, the PCB, the second LGA, and the power supply as a stack of components.

In a related aspect of the invention, a cooling component is positioned above the chip module, and the package may include multiple printed circuit boards in which one of the multiple printed circuit boards may include capacitors.

In a related aspect of the invention, the package may further include multiple electrical components.

In a related aspect of the invention the chip module package is used in a computer system.

In a related aspect of the invention, the second LGA is positioned between a power supply and a bottom surface of the PCB, and the first LGA is positioned between the chip module and a top surface of the PCB, and a cooling component is positioned above the chip module.

In a related aspect of the invention, the support frame is a single load spring system.

In another related aspect of the invention, the adjustable support frame includes a series of elements coupled together to form a perimeter about the chip module package. A plurality of first slidable elements interrelate with a plurality of substantially perpendicular second elements, and a resilient member interacts with an adjustable member. The resilient member is coupled to end portions of the first elements such that when the adjustable member is moved in a specified direction, the resilient member is adapted to urge the first slidable elements to move the second elements toward each other providing compression of the chip module package.

In another related aspect of the invention, the adjustable support frame includes a top support plate and bottom support plate for supporting the stack of components therebetween. Support posts for engaging the top and bottom support plates maintain separation thereof, and enable movement of the support plates relative to the other support plate. A means for adjusting the support posts is provided to hold the top support plate and bottom support plate in compression.

In a related aspect of the invention, the adjustable support frame includes a series of elements coupled together to form a perimeter about the chip module. A plurality of top first slidable elements are coupled to a top second element and a first LGA housing structure, and a plurality of bottom first slidable elements are coupled to a bottom second element and a second LGA housing structure. End portions of the top first elements are coupled to a top resilient element which interacts with a top adjustable member, and end portions of the bottom first elements are coupled to a bottom resilient element which interacts with a bottom adjustable member. The top and bottom resilient members are adapted to move using the top and bottom adjustable members such that the top and bottom first slidable elements urge the top and bottom second elements independently toward each other providing separate top and bottom compression of the chip module package.

In a further aspect of the invention a chip module package or system for use with a computer system comprises a first LGA positioned between and coupled to a chip module and a top surface of a first printed circuit board (PCB). A power supply component is positioned between and coupled to a second LGA and a bottom side of the PCB. A cooling component is positioned above the chip module, and an adjustable support frame is adapted to couple together the first LGA, the PCB, and the second LGA, the power supply and the cooling component, thereby coupling together the chip module package.

In another aspect of the invention a method of packaging a chip module for use with a computer system comprises providing a chip module, a first LGA and a second LGA, providing a power supply component, providing a cooling component, and providing an adjustable support frame. The first LGA is positioned between and coupled to a chip module and a top surface of a first printed circuit board (PCB). The second LGA is positioned between and coupled to the power supply and a bottom side of the PCB. The cooling component is positioned above the chip module. The adjustable support frame is adapted to selectively couple together the chip module, the first and second LGAs, the PCB, and the power supply and the cooling component. The adjustable support frame is closed to compress the chip module, the first and second LGAs, the PCB, the power supply and the cooling component into a complete chip module package as one embodiment of the present invention.

In another aspect of the invention, a chip module kit for use with a computer system comprises a first LGA positioned between and coupled to a chip module and a top surface of a first printed circuit board (PCB). A power supply component is positioned between and coupled to a second LGA and a bottom side of the PCB. A cooling component is positioned above the chip module, and an adjustable support frame is adapted to couple together the first LGA, the PCB, and the second LGA, the power supply and the cooling component.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

Figure 1:
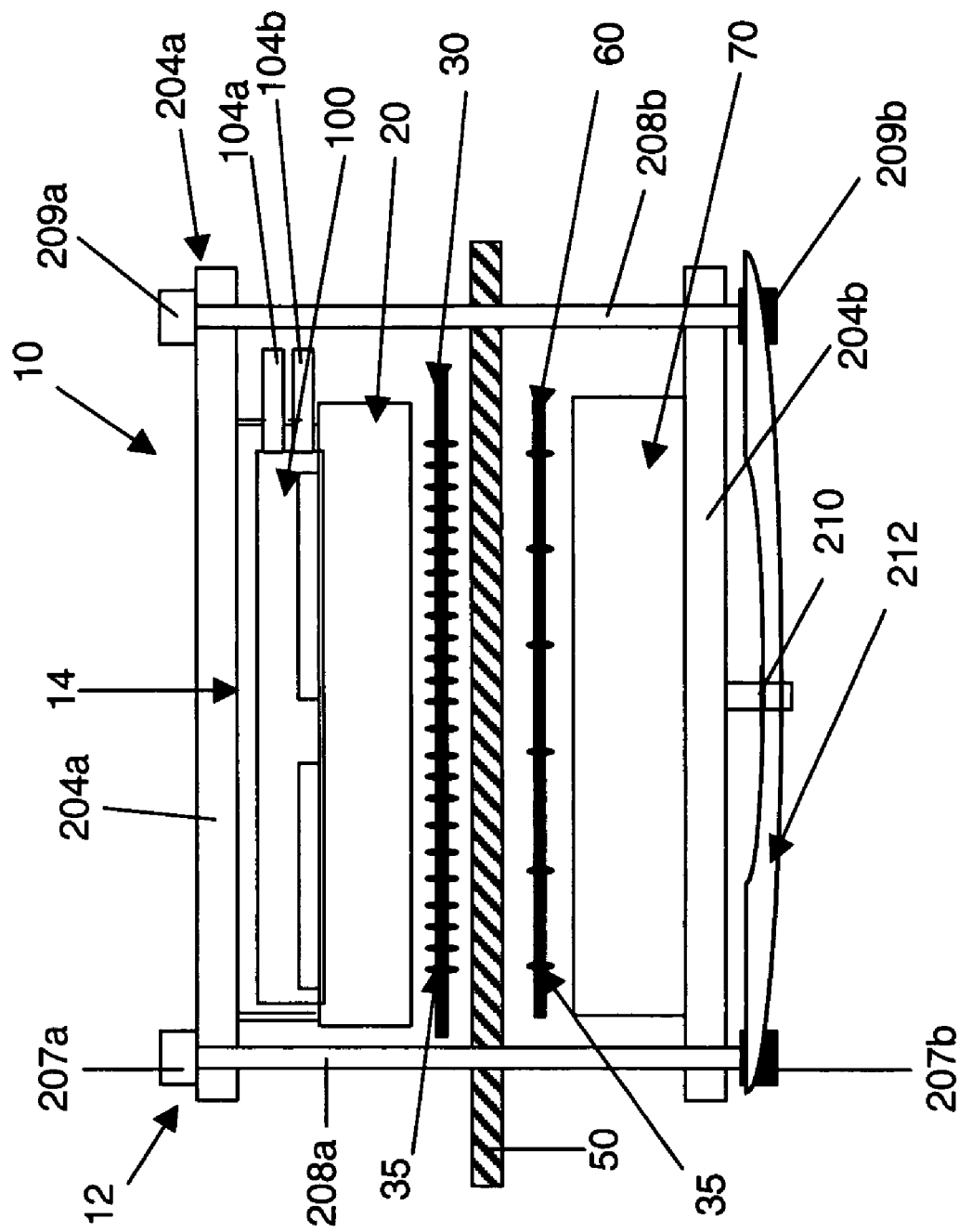
FIG. 1 is a front elevational view of a chip module package in an open position showing a printed circuit board (PCB) in cross-section, chip module, cooler, power supply, two LGA connectors, and a support frame.

The present invention provides a chip module package/system or a kit which provides multiple components surrounded by an adjustable frame which compressibly holds the components together while allowing for detaching the components after the frame is opened. Referring to FIG. 1, the present invention includes the placement of a power supply 70 on the bottom side of a printed circuit board (PCB) 50, preferably in the shadow of a integrated circuit (IC) or chip module 20. The PCB includes conducting vias extending from the bottom to the top of the PCB 50. This allows power connections to be only one PCB board thickness away from the module bottom. Further, the power supply located on the PCB bottom could be connected to the PCB by means of a land grid array (LGA), thus enabling the field replicability of the power supply which is prone to field failure. An upper LGA 30 is above the PCB 50 and the lower LGA 60 is positioned below the PCB 50, as shown in FIG. 1. The upper LGA 30 and lower LGA 60 include annular pads or connectors 35 providing conducting pathways between the PCB and the module and between the PCB and power supply to the LGAs when the module package is compressed into a closed position. The module is held together by the constant pressure of a frame 12 when the frame 12 is in the closed position.

Referring to FIG. 1, the upper LGA 30 includes annular pads or connectors 35, which have, for example, one millimeter distance between the center of a connector 35 and the center of the next connector 35. The lower LGA 60 includes connectors 35, which have, for example, one quarter of the quantity of the connectors for the upper LGA 30. The upper and lower LGAs 30, 60, respectively, receive voltage and signals through the connectors 35. The lower LGA 60 only receives voltage, so less connectors 35 are needed to spread the power evenly. The design and constituent materials of the upper and lower LGA contacts may differ, e.g., a power LGA may have a larger diameter and be made of different conducting metals.

In one aspect, this invention (as shown in FIG. 1) entails a package design or packaging system including a stack of components 14 where a chip module 20 is connected to a PCB 50 via an LGA on the top surface of the PCB 50, and where a power supply 70 is connected to the PCB via lower LGA 60 communicating with the bottom surface of the PCB 50. The stack of components 14 includes, in the example shown in FIG. 1, the cooler 100, the module 20, an upper LGA 30, PCB 50, lower LGA 60, and power supply (PS) 70 is held in place with actuation hardware, e.g., the frame 12 (shown in FIG. 1). The frame 12 is adjustable and allows for field replicability of either the chip module 20 or the PS 70 and provides the shortest possible wiring distance from the PS 70 to the chip module 20 leading to highest performance.

Figure 4:
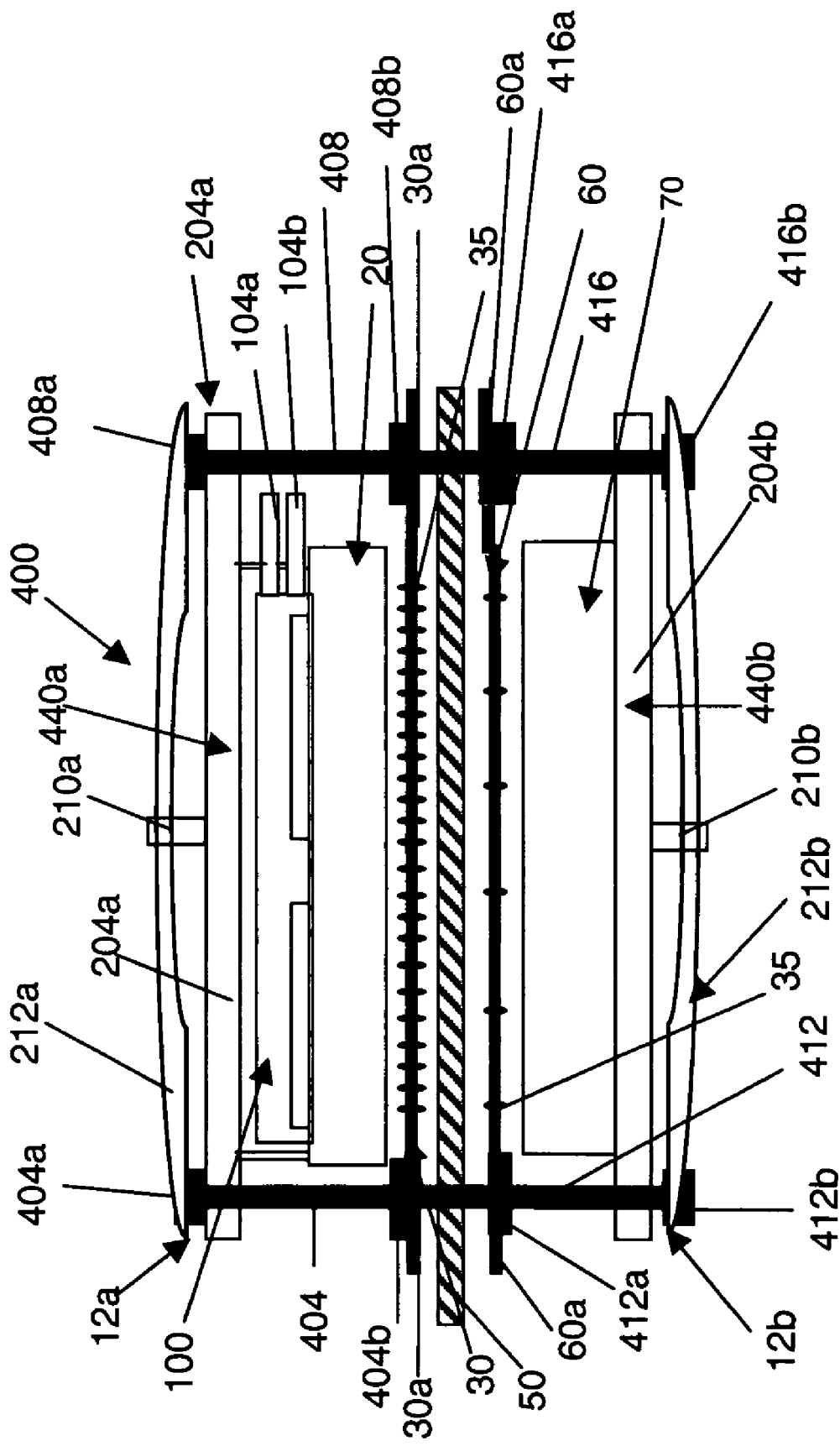
FIG. 4 is a front elevational view of an open chip module package showing a printed circuit board (PCB) in cross-section, and where independent frames are positioned above and below the PCB.

The frame 12 or actuation hardware could be either a single load spring system holding the entire stack of components 14 together (as shown in FIG. 1), or two separate spring systems connected to a central adjustable frame (as shown in FIG. 4) to allow independent replacement of either the chip module 20 or the power supply 70 upon field failure or upgrade requirements.

Referring to FIG. 1, a first embodiment of a chip module package 10 comprises, a stack of components 14 including the cooler 100, chip module 20, upper LGA 30, PCB 50, lower LGA 60, and power supply 70 held together with a single spring system or frame 12, and may also be referred to as the "clamshell design". In this design the total force on each LGA should be equal. This may be accomplished using the same number of contacts of the same type. Alternatively, different numbers of contacts for each LGA may be used, where the force per contact would be unequal.

Referring again to FIG. 1, the chip module package 10 comprises the frame 12 which includes a stiffener plate 204a at the top of the module and a stiffener plate 204b at the bottom of the module package 10 connected by slidable posts 208a and 208b. The posts 208a and 208b connect to a resilient spring plate 212 at the bottom of the module package 10. Four posts may be implemented to hold the module package 10 with two posts 208a and 208b being visible in FIG. 1. The coupling of the posts, stiffener plate, and spring plate result in the frame 12 about the module components. A water cooler 100 is positioned above the chip module. Thereby, the water cooler 100 is positioned as part of an upper part of the component stack 14 where the upper part of the component stack is defined as all components above the PCB 50, and the lower part of the component stack 14 is defined as all components below the PCB 50. In this embodiment, the inlet and outlet water ports 104a and 104b of the water cooler 100 are accommodated by protruding either through the stiffener/loadplate 204a or exit laterally to avoid interference with the load plate and would exit between two load posts, e.g., 208a and 208b. Other cooling devices may be used, for example, cooling devices using fins, or other liquid circulating cooling devices.

A screw 210 is attached to the spring plate 212 by a threaded connection presses against into the stiffener plate 204b when screwed toward it. When the screw 210 is adjusted in one direction, the ends of the spring plate 212 are pulled downwardly in concert with the screw. Thereby, the ends of the spring plate 212 connected to the bottom ends 209b and 207b of the slidable posts 208a, 208b move downwardly, and the top ends 209a and 207a of the slidable posts 208a and 208b at the top of the module pull the components in the module closer together.

Referring again to FIG. 1, a power supply 70 is positioned beneath the lower LGA 60 and above the stiffener plate 204b. The power supply 70 is connected to the PCB 50 via the lower LGA 60. Thus, an embodiment of the unique electronic module package 10 according to the invention is shown in FIG. 1, whereby the surrounding actuating hardware comprise a frame 12 defining the perimeter of the module package 10, i.e., the spring plate 212, the posts 208a, 208b, and the stiffener plates 204a, 204b, hold together both the module 20 and the power supply 70 each with their respective land grid arrays 30, 60. The posts 208a, 208b and stiffener plates 204a, 204b are slidably coupled and substantially perpendicular to each other. FIG. 1 also shows an optional cooler in the compressed stack.

An advantage of the present module package 10 results from combining the upper LGA 30 with the water cooler 100 and the chip module 20 sandwiched between to make a comparably thin package and eliminate the need for fins used for cooling. Another advantage of the invention is that the components are field replaceable. For example, the power supply 70 and/or the chip module 20 are field replaceable. Since both of the components are field replaceable, an engineer can replace the components in the field, e.g., replacing either the power supply or replacing the chip module or both. In PGA and BGA type surface-mount packaging used for integrated circuits, the pins or balls are used to conduct electrical signals from the integrated circuit to a printed circuit board (PCB) it is placed on. However, if the components are not held together by land grid array technology, repair to the chip module is completed by shipping the module to a repair facility. Thus, the system according to the present invention allows repair in the field of the chip module.

Referring again to FIG. 1, the embodiment of the present invention positions a power supply 70 underneath the module 20 using a land grid array connect 60. Further, the present invention includes a micro-channel cooler 100, i.e., a water cooler, positioned above the chip 20. The power supply 70 and the water cooler 100 can be part of the chip module package 10 individually or in combination as in the embodiment show in FIG. 1. Also, the module package 10 or component stack 14 may include multiple chips (not shown).

Figure 2:
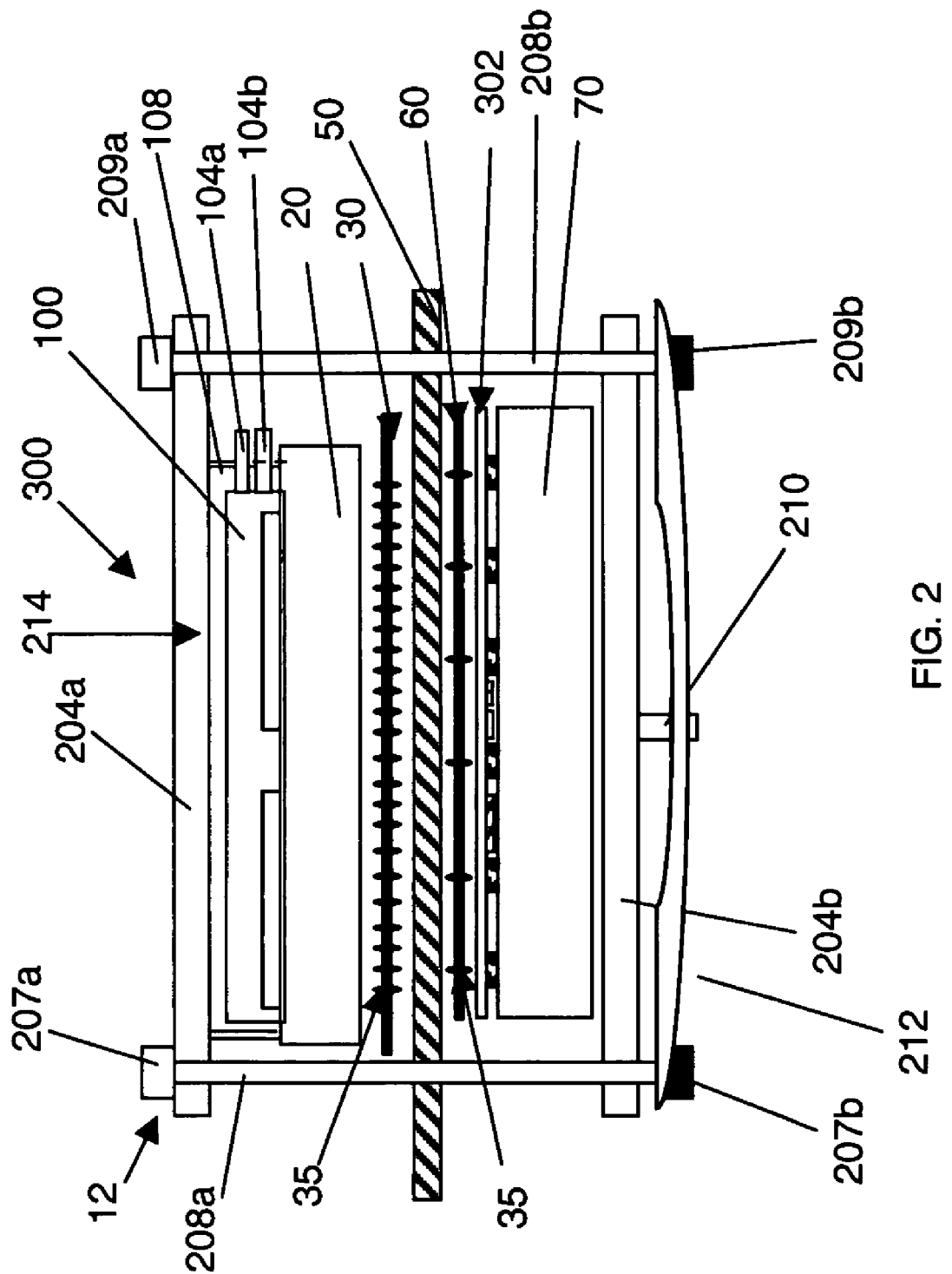
FIG. 2 is a front elevational view of a chip module package similar to the module shown in FIG. 1 including a circuit board including capacitors.

Referring to FIG. 2, another embodiment of a module package 300 includes a component stack 214 similar to the component stack 14 of the embodiment shown in FIG. 1, however, a PCB 302 is positioned above the power supply 70 in addition to the PCB 50 shown in module package 10, such that the PCB 302 is positioned between the lower LGA 60 and the power supply 70. The PCB 302 is advantageously positioned in the module package 300 by holding other circuitry operable in conjunction with the power supply, such as resistors and capacitors. Thus, module package 300 provides more processing and packaging capabilities.

Figure 3:
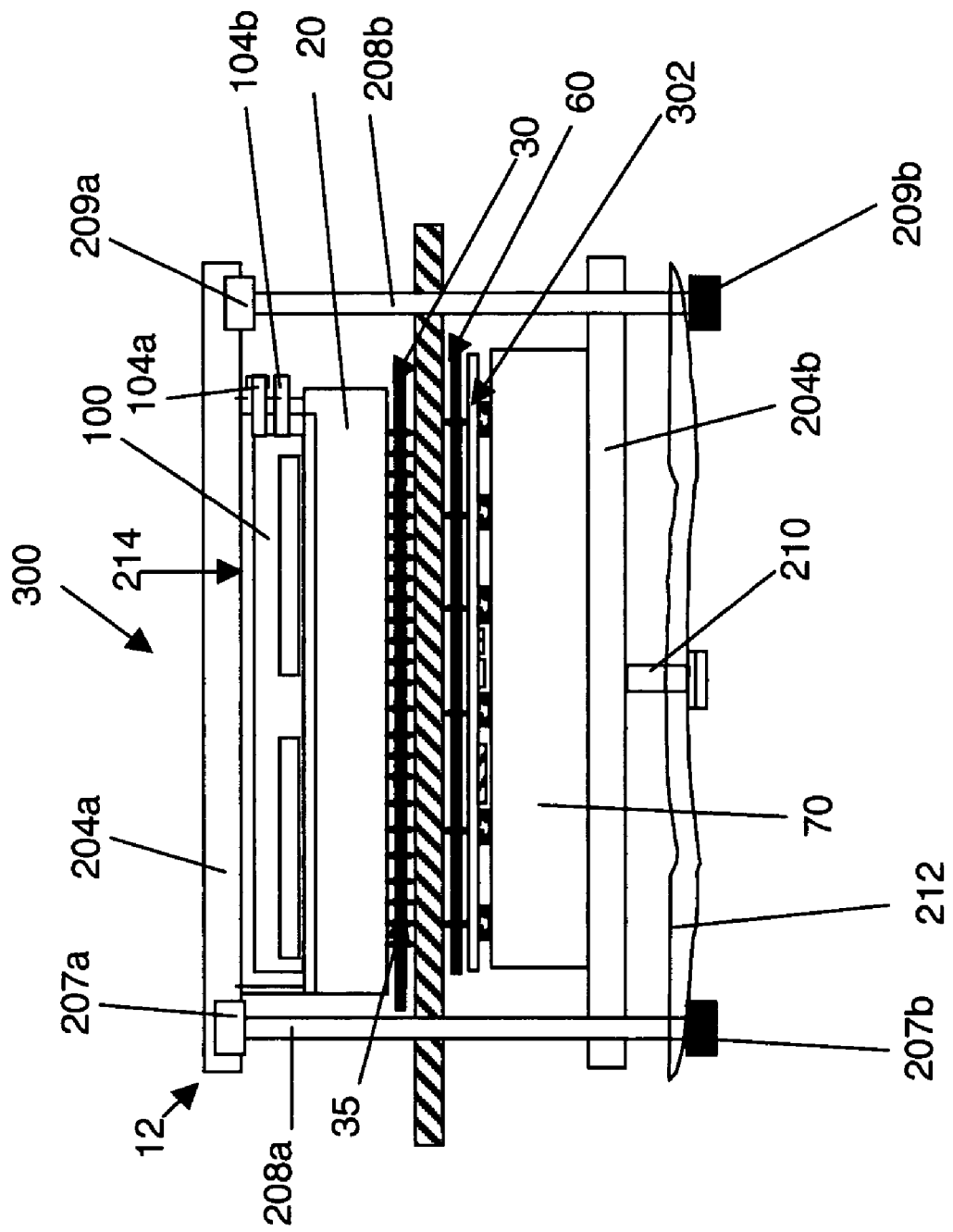
FIG. 3 is a front elevational view of the chip module package shown in FIG. 2 in a closed position.

FIG. 3 depicts the module package 300 shown in FIG. 2 in a closed position wherein the components between the stiffener plates 204a and 204b are compressed. The screw 210 is extended to result in the spring plate 212 being extended downwardly to draw the ends 207a and 209a of the slidable posts 208a, 208b and the stiffener plate 204a towards the opposing stiffener plate 204b to hold the package 300 in compression.

Referring to FIG. 4, another embodiment of a module package of the present invention is shown which includes a first set of fixed posts 404 and 408 attached at ends 404a and 408a, respectively, to a top spring plate 212a and pass through the stiffener plate 204a. Further, the posts 404 and 408 are attached at ends 404b and 408b to the PCB via a structure 30a at least partially housing the upper LGA 30. A second set of fixed posts 412 and 416 are connected at respective ends 412a and 416a to a structure 60a attached ridgidly to PCB at least partially housing the lower LGA 60, and are attached to the bottom spring plate 212b at respective ends 412b and 416b after passing through the stiffener plate 204b. The posts 404, 408, 412, and 416 avoid the module 20 and power supply 70.

The package 400 shown in FIG. 4 differs from the packages 10 and 300 shown in FIGS. 1 and 2 because the posts are divided to separate the stack compression of the top side and its components from the stack components of the bottom side and its components instead of passing through the PCB 50 as in module packages 300 and 10. Further, the PCB 50 is compressed between the upper and lower LGAs 30, 60, respectively, by the ends 404b and 412a on one side, and by 408b and 416a on the other side of the package. Thus, separate and independent upper and lower frames 12a, 12b, respectively, are formed over and under the PCB 50, where the upper frame 12a comprising posts 404, 408, stiffener plate 204a and top spring plate 212a compress the stack of components 440a comprising the water cooler 100, chip module 20, and upper LGA 30. The lower frame 12b comprising posts 412, 416, stiffener plate 204b and bottom spring plate 212b compress the stack of components 440b comprising the PS 70 and the lower LGA 60. The components above and beneath the PCB can thereby be compressed independently from one another using the screws 210a and 210b, as described in embodiment 10, to adjust the compression of the package. An advantage of this package 400 in addition to the independent compression, is that only one side of the package need be opened to service a component. For example, if a component on the bottom of the package needs to be removed, then only the bottom of the package needs to be opened.

Positioning the power supply 70 under the module 20 advantageously decreases the distance between the power supply and the module, thus increasing power supply performance. Further, the time delay between when the module calls for power and when the power is received by the module 20 is less because of the decreased proximity of the power supply to the module 20. It is more advantageous to have the power supply close to the module to minimize the need for capacitors which require valuable real estate on the module.

Another embodiment of the present invention implements a heat spreader with fins instead of the water cooler 100 for each of the embodiments depicted in FIGS. 1-4. The fins are typically pieces of metal that project at right angles from a hot surface and act to draw away the heat and present a large surface area for air to remove the heat. A typical air heat sink consists of a block of conducting metal (e.g., aluminum or copper) that sits on the hot surface (e.g., the chip) and which has such fins attached at right angles. Alternatively, a heat sink can be made by taking a block of metal and machining a series of deep grooves into it, thus defining fins without the need to attach fins by methods such as soldering or welding.

In another embodiment according to the present invention the bottom of a fin heat spreader can act as the load plate for the top module LGA 30 by embedding load posts into the metal either as blind tapped holes or through holes with bolts on the top fin surface.

In another embodiment according to the present invention, the power supply will itself have fins for heat dissipation. In such a case, either a rigid frame or plate may be built between the power supply and the PCB 50 to accommodate the load bearing posts 208a and 208b, shown in FIGS. 1-3, or a rigid metal plate sleeve that would go over the fins (the fins passing through slots), extend laterally beyond the power supply and provide a means of attaching load posts and a spring system.

Other embodiments according to the present invention include utilizing hybrid LGA/BGA/s instead of the LGAs. A hybrid LGA, by itself, is known generally in the art and includes a compliant connector on one side of an insulating carrier and a BGA solder connection on the other side. The solder connection side would usually, but not necessarily, be soldered to the PCB. The compliant sides would extend outward from the PCB to make contact with a chip module or a power supply mating surface. However, any combination of BGA or compliant connectors could be used. Dual hybrid stack embodiments may include, for example, BGA to module and BGA to power supply, or BGA to board from both top and bottom, or BGA to module and bottom of board, or BGA to PS and top of board.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A chip module package or system for use with an electronic device, which comprises:
a first land grid array (LGA) positioned between and coupled to a chip module and a first side of a first printed circuit board (PCB);
a second LGA positioned between and coupled to a power supply and a second side of the first PCB, the second LGA having connections for electrically coupling the power supply to the PCB, the second LGA's connections electrically coupling the power supply to the second side of the first PCB, the second LGA, which includes the connections, being between the first PCB and the power supply; and
an adjustable support frame adapted to compressively support the first LGA, the PCB, the second LGA, and the power supply as a stack of components.

2. The package of claim 1 further including a cooling component positioned above the chip module.

3. The package of claim 1 further including multiple printed circuit boards including a second PCB positioned between the power supply and the second LGA.

4. The package of claim 3 wherein at least one of the multiple printed circuit boards includes capacitors.

5. The package of claim 1 wherein the chip module package is used in a computer system.

6. The package of claim 1 wherein the power supply is positioned beneath the chip module.

7. The package of claim 1 further including multiple electrical components.

8. The package of claim 1 wherein the second LGA is positioned between a power supply and a bottom surface of the first PCB, and the first LGA is positioned between the chip module and a top surface of the first PCB, and a cooling component is positioned above the chip module.

9. The package of claim 8 wherein the cooling component is liquid cooled.

10. The package of claim 1 wherein the support frame is a single load spring system.

11. The package of claim 1 wherein the adjustable support frame includes a series of elements coupled together to form a perimeter about the chip module package, and a plurality of first slidable elements interrelate with a plurality of substantially perpendicular second elements, a resilient member interacts with an adjustable member and the resilient member being coupled to end portions of the first slidable elements such that when the adjustable member is moved in a specified direction, the resilient member is adapted to urge the first slidable elements to move the second elements toward each other providing compression of the chip module package.

12. The package of claim 1 wherein the adjustable support frame includes a top support plate and bottom support plate for supporting the stack of components therebetween;
support posts for engaging the top and bottom support plates and maintaining separation thereof and enabling movement of the support plates relative to the other support plate;
means for adjusting the support posts to hold the top support plate and bottom support plate in compression.

13. The package of claim 1 wherein the adjustable support frame includes a series of elements coupled together to form a perimeter about the chip module, and a plurality of top first slidable elements are coupled to a top second element and a first LGA housing structure, and a plurality of bottom first slidable elements are coupled to a bottom second element and a second LGA housing structure, and end portions of the top first elements are coupled to a top resilient element which interacts with a top adjustable member, and end portions of the bottom first elements are coupled to a bottom resilient element which interacts with a bottom adjustable member, whereby the top and bottom resilient members are adapted to move using the top and bottom adjustable members such that the top and bottom first slidable elements urge the top and bottom second elements independently toward each other providing separate top and bottom compression of the chip module package.

14. A chip module package or system for use with an electronic device, which comprises:
a first LGA positioned between and coupled to a chip module and a top surface of a first printed circuit board (PCB);
a power supply component positioned between and coupled to a second LGA and a bottom side of the PCB, the second LGA's connections electrically coupling the power supply to the bottom side of the first PCB, the second LGA, which includes the connections, being between the first PCB and the power supply;

a cooling component positioned above the chip module; and an adjustable support frame adapted to couple together the first LGA, the PCB, and the second LGA, the power supply and the cooling component, thereby coupling together the chip module package.

15. The package of claim 1 wherein the chip module package is used in a computer system.

16. The package of claim 14, wherein the adjustable support frame includes a series of elements coupled together to form a perimeter about the chip module, the adjustable support frame includes four first slidable elements which interrelate with four substantially perpendicular second elements, a resilient member interacts with an adjustable member and the resilient member being coupled to end portions of the first elements, such that when the adjustable member is moved in a specified direction, the resilient member urges the first slidable elements to move the second elements toward each other providing compression of the chip module package.

17. The package of claim 14 wherein the adjustable support frame includes a top support plate and bottom support plate for supporting the stack of components therebetween;

support posts for engaging the top and bottom support plates and maintaining separation thereof and enabling movement of the support plates relative to the other support plate;

means for adjusting the support posts to hold the top support plate and bottom support plate in compression.

18. The package of claim 14, wherein the adjustable support frame includes four top first slidable elements coupled to a top second element and a first LGA frame, and the adjustable support frame includes four bottom first slidable elements coupled to a bottom second element and a second LGA frame, end portions of the top first elements being coupled to a top resilient element which interacts with a top adjustable member, and end portions of the four bottom first elements being coupled to a bottom resilient element which interacts with a bottom adjustable member, whereby the top and bottom resilient members are adjusted using the top and bottom adjustable members and the top and bottom resilient members move the top and bottom first slidable elements to independently urge the top and bottom second elements toward each other providing separate top and bottom compression of the chip module package.

19. A method of packaging a chip module for use with a computer system comprising:

providing a chip module;

providing a first LGA and a second LGA;

providing a power supply component;

providing a cooling component;

providing an adjustable support frame;

positioning the first LGA between and coupled to a chip module and a top surface of a first printed circuit board (PCB);

positioning the second LGA between and coupled to the power supply and a bottom side of the PCB, the second LGA, which includes the connections, being between the first PCB and the power supply;

positioning the cooling component above the chip module;

adapting the adjustable support frame to selectively couple together the chip module, the first and second LGAs, the PCB, the power supply and the cooling component; and closing the adjustable support frame to compress the chip module, the first and second LGAs, the PCB, the power supply and the cooling component into a chip module package.

20. A chip module kit for use with an electronic device, which comprises:

a first LGA positioned between and coupled to a chip module and a top surface of a first printed circuit board (PCB);

a power supply component positioned between and coupled to a second LGA and a bottom side of the PCB, the second LGA, which includes the connections, being between the first PCB and the power supply;

a cooling component positioned above the chip module; and an adjustable support frame adapted to couple together the first LGA, the PCB, and the second LGA, the power supply and the cooling component.

* * * * *